US011622473B2

(12) United States Patent
Chiang et al.

(10) Patent No.: US 11,622,473 B2
(45) Date of Patent: Apr. 4, 2023

(54) ELECTRICAL CONNECTION APPARATUS

(71) Applicant: Molex, LLC, Lisle, IL (US)

(72) Inventors: Chun-Hsiang Chiang, New Taipei (TW); Yen-Lin Chen, New Taipei (TW); Hung-Chang Liu, New Taipei (TW)

(73) Assignee: Molex, LLC, Lisle, IL (US)

(*) Notice: Subject to any disclaimer, the term of this patent is extended or adjusted under 35 U.S.C. 154(b) by 342 days.

(21) Appl. No.: 16/836,954

(22) Filed: Apr. 1, 2020

(65) Prior Publication Data

US 2020/0323105 A1    Oct. 8, 2020

(30) Foreign Application Priority Data

Apr. 8, 2019 (CN) .......................... 201920466666.4
Aug. 13, 2019 (CN) .......................... 201921310811.6

(51) Int. Cl.
*H05K 7/20* (2006.01)
*G02B 6/42* (2006.01)
*H01R 13/46* (2006.01)

(52) U.S. Cl.
CPC ....... *H05K 7/20409* (2013.01); *G02B 6/4269* (2013.01); *H01R 13/46* (2013.01); *H05K 7/20481* (2013.01)

(58) Field of Classification Search
CPC .......... H05K 7/20409–20418; H05K 7/20454; H05K 7/20472–20481; H05K 7/2049; G02B 6/4266–4273; H01R 13/6581; H01R 24/28; H01R 24/64; H01R 25/006; H01R 2107/00
See application file for complete search history.

(56) References Cited

U.S. PATENT DOCUMENTS

| | | | |
|---|---|---|---|
| 6,749,448 B2 * | 6/2004 | Bright ................ | H05K 7/20418 439/152 |
| 6,893,293 B2 * | 5/2005 | Ice ..................... | H01R 13/6596 439/607.2 |
| 7,448,921 B2 * | 11/2008 | Kim ..................... | H05K 5/0286 439/744 |
| 7,974,098 B2 | 7/2011 | Oki et al. | |
| 8,081,470 B2 * | 12/2011 | Oki ..................... | G02B 6/4201 165/185 |
| 8,911,244 B2 * | 12/2014 | Elison ................ | H05K 7/20409 439/137 |
| 2018/0199468 A1 * | 7/2018 | Hall, III ............... | G02B 6/4246 |

FOREIGN PATENT DOCUMENTS

WO    2014/075429 A1    5/2014

* cited by examiner

*Primary Examiner* — Zachary Pape

(57) ABSTRACT

The present disclosure provides an electrical connection apparatus which includes a receptacle and a plug. The receptacle includes a cage, a heat sink, a thermal interface material layer, and an elastic sheathing member. The heat sink is provided to the cage and has a base portion. The base portion has a lower surface, a first side edge close to the port, and a second side edge spaced apart from the first side edge. The heat sink further has two first convex portions positioned on the lower surface and adjacent to the first side edge and a first concave portion positioned on the lower surface and adjacent to the second side edge. The thermal interface material layer is provided to the lower surface of the base portion. The elastic sheathing member sheathes the heat sink and the cage. The plug includes a second convex portion positioned on an upper surface.

20 Claims, 13 Drawing Sheets

ELECTRICAL CONNECTION APPARATUS

RELATED APPLICATION

This application claims priority to Chinese Application No. 201920466666.4, filed on Apr. 8, 2019, and priority to Chinese Application No 201921310811.6, filed on Aug. 13, 2019, both of which are incorporated by reference in their entirety.

TECHNICAL FIELD

The present disclosure relates to an electrical connection apparatus, particularly relates to a pluggable electrical connection apparatus.

BACKGROUND

SFP (Small Form-factor Pluggable) connectors are widely used in the field of data communication, optical fiber cable and the like, and are mainly provided to a device, such as switch, router and the like. International patent application publication No. WO2014/075429A1 (hereinafter referred to as a first prior art) discloses a heat sink with a pluggable heat source, which includes a heat dissipating plate, a boss, a heat conducting medium, a bearing plate, a plurality of screws, a plurality of support posts, a plurality of springs and a heat source component. Referring to FIG. 2 of the first prior art, the boss is provided below the heat dissipating plate and has a plurality of arc-shaped protrusions. The heat conducting medium is provided to the boss to improve heat conduction effect of the heat dissipating plate. The heat dissipating plate is positioned above the bearing plate, spaced apart from the bearing plate, and locked to the support posts by the screws passing through the heat dissipating plate, thereby limiting a path that the heat dissipating plate moves up and down. The springs sheathe the screws to provide an elastic downward pressure of the heat dissipating plate. The heat source component is used to be inserted into a space between the heat dissipating plate and the bearing plate, and is fixed to the heat dissipating plate through the cooperation of the plurality of recessed grooves and the plurality of arc-shaped protrusions. However, when the heat source component has not been fully inserted, that is, the protrusion on the right of FIG. 2 of the first prior art has contacted the heat source component, but the protrusion on the left does not contact the heat source component, a left half of the heat dissipating plate will be inclined (the left half is lower and a right half is higher) due to the elastic downward pressure of the spring, which easily causes a front end of the heat source component to scrape the heat dissipating plate in the insertion process, and in turn causes the heat conduction effect of the heat dissipating plate to be reduced. In addition, US patent application issuance publication No. U.S. Pat. No. 7,974,098 B2 (hereinafter referred to as a second prior art) also discloses a pluggable transceiver. Referring to FIG. 3A of the second prior art, it can be known that when a housing of the pluggable transceiver is inserted into below a heat sink, an inclination of the heat sink similar to that of the first prior art will also occur. In addition, referring to FIG. 2C of the second prior art, a bottom surface of the heat sink of the second prior art is configured with a total of four tracks for projections of the housing to move in the tracks to engage with recessed grooves of the bottom surface of the heat sink. However, the four tracks need to occupy a certain area, which reduces the actual heat conduction area of the heat sink, thereby reducing the heat dissipation effect of the heat sink.

SUMMARY

Therefore, one of objects of the present disclosure is to provide an electrical connection apparatus which can increase the effective heat conduction area of the thermal interface material layer and reduce the scraping of the thermal interface material layer.

Therefore, in some embodiments, an electric connection apparatus of the present disclosure comprises a receptacle and a plug. The receptacle comprises a cage, a heat sink, a thermal interface material layer and an elastic sheathing member. The cage defines an accommodation space extending along a mating direction and being elongated and a port communicated with the accommodation space in the mating direction, the cage has an upper wall, the upper wall has an opening communicated with the accommodation space. The heat sink is provided to the upper wall and has a base portion extending into the opening, the base portion has a lower surface facing the accommodation space, a first side edge close to the port and a second side edge spaced apart from the first side edge in the mating direction, the heat sink further has two first convex portions positioned on the lower surface of the base portion and adjacent to the first side edge and a first concave portion positioned on the lower surface and adjacent to the second side edge, the first concave portion is positioned on a line which is parallel to the mating direction and passes through between the two first convex portions. The thermal interface material layer is provided on the lower surface of the base portion. The elastic sheathing member sheathes the heat sink and the cage, so that the base portion of the heat sink is elastically pressed downwardly into the opening of the cage. The plug comprises a housing, the housing has an upper surface, a second convex portion positioned on the upper surface and used to cooperate with the first concave portion and two second concave portions positioned on the upper surface and used to cooperate with the two first convex portions respectively, when mating of the plug and the receptacle is completed, the second convex portion and the two second concave portions are respectively engaged with the first concave portion and the two first convex portions in concave-convex cooperation, the thermal interface material layer is attached to the upper surface.

In some embodiments, the thermal interface material layer is mainly composed of graphene.

In some embodiments, in the mating of the plug and the receptacle, the second convex portion and the two first convex portions are correspondingly distributed at three vertices of a triangle, and the second convex portion abuts against the thermal interface material layer, the two first convex portions abut against the upper surface of the housing, so that a gap is formed between the upper surface of the housing and the thermal interface material layer.

In some embodiments, the base portion is a boss, and the first side edge forms a first inclined surface for the second convex portion to slide over to abut against the lower surface of the base portion.

In some embodiments, the two first convex portions are arranged in a direction parallel to the first side edge and closely adjacent to the first side edge.

In some embodiments, the two first convex portions and the second convex portion are arc-shaped in the mating direction.

In some embodiments, the cage further has two side walls respectively extending downwardly from two opposite sides of the upper wall, each side wall has a plurality of latching portions, the heat sink further has a heat conduction plate portion and a plurality of heat dissipating fin portions, and the heat conduction plate portion has a bottom surface connected to the base portion and a top surface opposite to the bottom surface, the plurality of the heat dissipating fin portions are provided on the top surface, the elastic sheathing member has two elastic downward pressing portions for passing through between the plurality of the heat dissipating fin portions and abutting against the top surface of the heat conduction plate portion and two side engaging plate portions connected to two ends of the two elastic downward pressing portions and detachably latched to the latching portions of the two side walls.

In some embodiments, the base portion further has two third side edges positioned at opposite positions and connecting the first side edge and the second side edge, and the thermal interface material layer is positioned between the two first convex portions and the first concave portion and flush with the third side edges at two sides thereof.

In addition, in some other embodiments, an electric connection apparatus of the present disclosure comprises a receptacle and a plug. The receptacle comprises a cage, a heat sink, a thermal interface material layer and an elastic sheathing member. The cage defines an accommodation space extending along a mating direction and being elongated and a port communicated with the accommodation space in the mating direction, the cage has an upper wall, the upper wall has an opening communicated with the accommodation space. The heat sink is provided to the upper wall and having a base portion extending into the opening, the base portion has a lower surface facing the accommodation space, a first side edge close to the port and a second side edge spaced apart from the first side edge in the mating direction, the heat sink further has a first convex portion provided on the lower surface of the base portion and close to the first side edge and two first concave portions provided on the lower surface and adjacent to the second side edge, the first concave portion is positioned on a line which is parallel to the mating direction and passes through between the two first concave portions. The thermal interface material layer is provided to the lower surface of the base portion. The elastic sheathing member sheathes the heat sink and the cage, so that the base portion of the heat sink being elastically pressed downwardly into the opening of the cage. The plug comprises a housing, the housing has an upper surface, two second convex portions positioned on the upper surface and used to cooperate with the first concave portions and a second concave portion positioned on the upper surface and used to cooperate with the first convex portion, when mating of the plug and the receptacle is completed, the two second convex portions and the second concave portion are respectively engaged with the first concave portion and the first convex portion in concave-convex cooperation, the thermal interface material layer is attached to the upper surface.

In some embodiments, the thermal interface material layer is mainly composed of graphene.

In some embodiments, in the mating of the plug and the receptacle, the two second convex portions and the first convex portion are correspondingly distributed at three vertices of a triangle, and the two second convex portions abut against the thermal interface material layer, the first convex portion abuts against the upper surface of the housing, so that a gap is formed between the upper surface of the housing and the thermal interface material layer.

In some embodiments, the base portion is a boss, the first side edge forms a first inclined surface for the two second convex portions to slide over to abut against the lower surface of the base portion.

In some embodiments, the first convex portion and the two second convex portions are arc-shaped in the mating direction.

In some embodiments, the cage further has two side walls respectively extending downwardly from two opposite sides of the upper wall, each side wall has a plurality of latching portions, the heat sink further has a heat conduction plate portion and a plurality of heat dissipating fin portions, the heat conduction plate portion has a bottom surface connected to the base portion and a top surface opposite to the bottom surface, the plurality of the heat dissipating fin portions are provided to the top surface, the elastic sheathing member has two elastic downward pressing portions for passing through between the plurality of the heat dissipating fin portions and abutting against the top surface of the heat conduction plate portion and two side engaging plate portions connected to two ends of the two elastic downward pressing portions and detachably latched to the latching portions of the two side walls.

In some embodiments, the base portion further has two third side edges positioned at opposite positions and connecting the first side edge and the second side edge, and the thermal interface material layer is positioned between the two first concave portions and the first convex portion and flush with the third side edges at two sides thereof.

The present disclosure has at least the following effects: in the process of inserting of the plug into the cage, the first convex portion at a bottom of the heat sink and the second convex portion of the plug are connected to form a triangle, so that a gap is formed between the upper surface of the housing and the thermal interface material layer to maintain the heat sink horizontal even if the plug is not fully inserted into the cage; in addition, in comparison with the four tracks in the second prior art, in the process of inserting of the plug of the present disclosure, an indentation is formed only on a position of the surface of the thermal interface material layer where the second convex portion passes through the thermal interface material layer, and has a higher heat dissipation effect in comparison with the second prior art.

BRIEF DESCRIPTION OF THE DRAWINGS

Other features and effects of the present invention will be apparent in embodiments with reference to the drawings, in which.

DETAILED DESCRIPTION OF PREFERRED EMBODIMENTS

Figure 1:
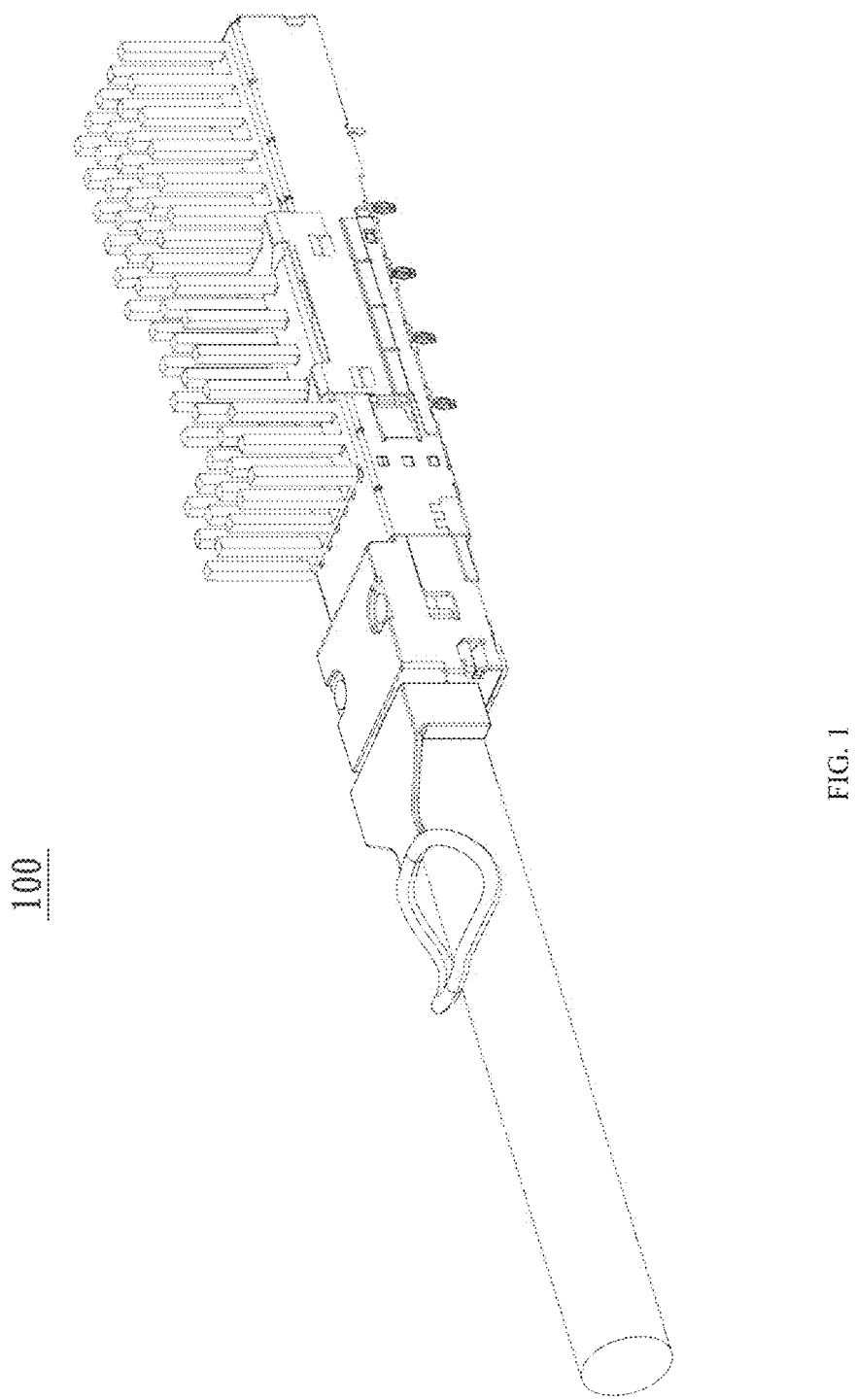
FIG. 1 is a perspective view of a first embodiment of an electrical connection apparatus of the present disclosure.

Before the present disclosure is described in detail, it should be noted that in the following description, similar elements are represented by the same reference numerals.

Figure 2:
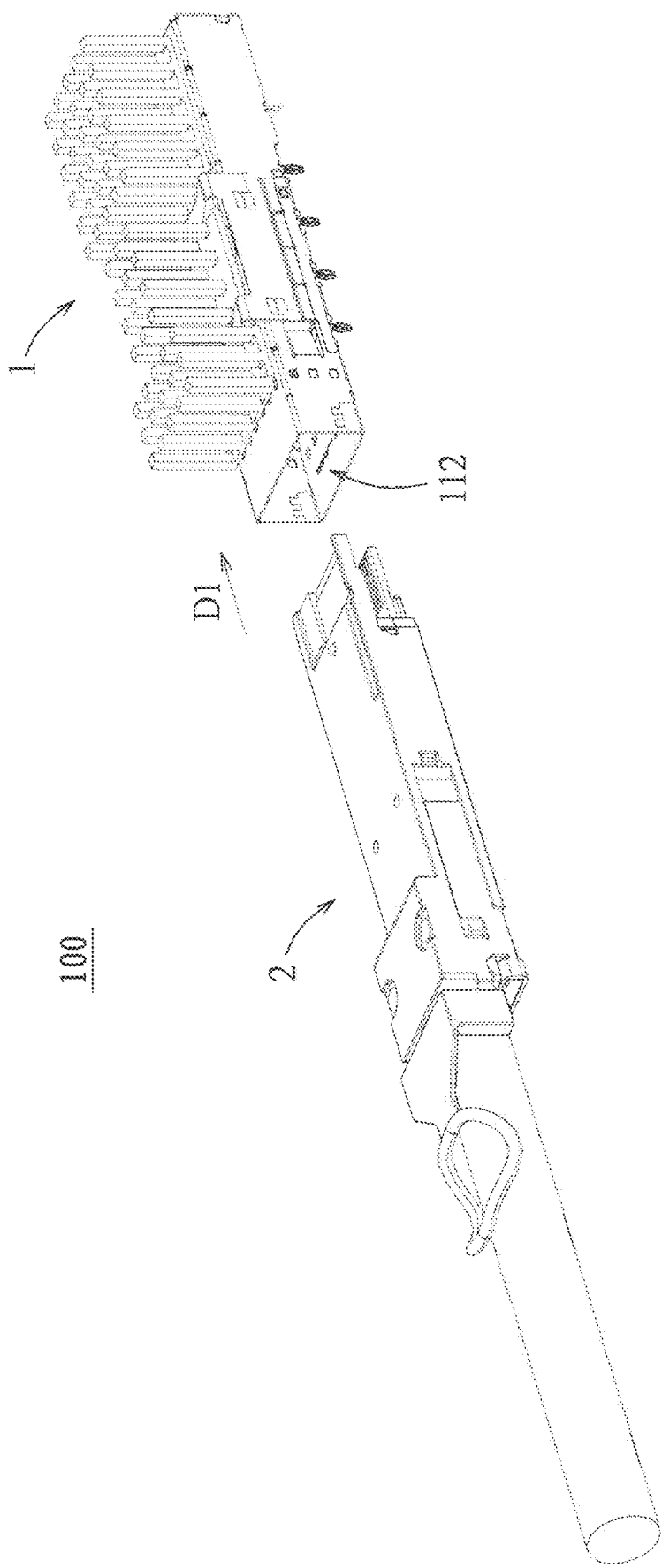
FIG. 2 is an exploded perspective view illustrating a state that a receptacle and a plug of the first embodiment are not mated with each other.

Referring to FIG. 1 and FIG. 2, an electrical connection apparatus 100 of the present disclosure is a SFP (Small Form-factor Pluggable) connector. A first embodiment of the electrical connection apparatus 100 includes a receptacle 1 and a plug 2. In the embodiment, the receptacle 1 is described as a board-end connector for an example, and is adapted to an electronic device (not shown) with data exchange function such as a data machine, a router, a computer host and the like, and is exposed to a mating port defined by an outer case of an electronic device. In the embodiment, the plug 2 is described as a cable-end connector, for an example, and is used to mate with the mating port of the electronic device so as to be electrically connected with the receptacle 1.

Figure 3:
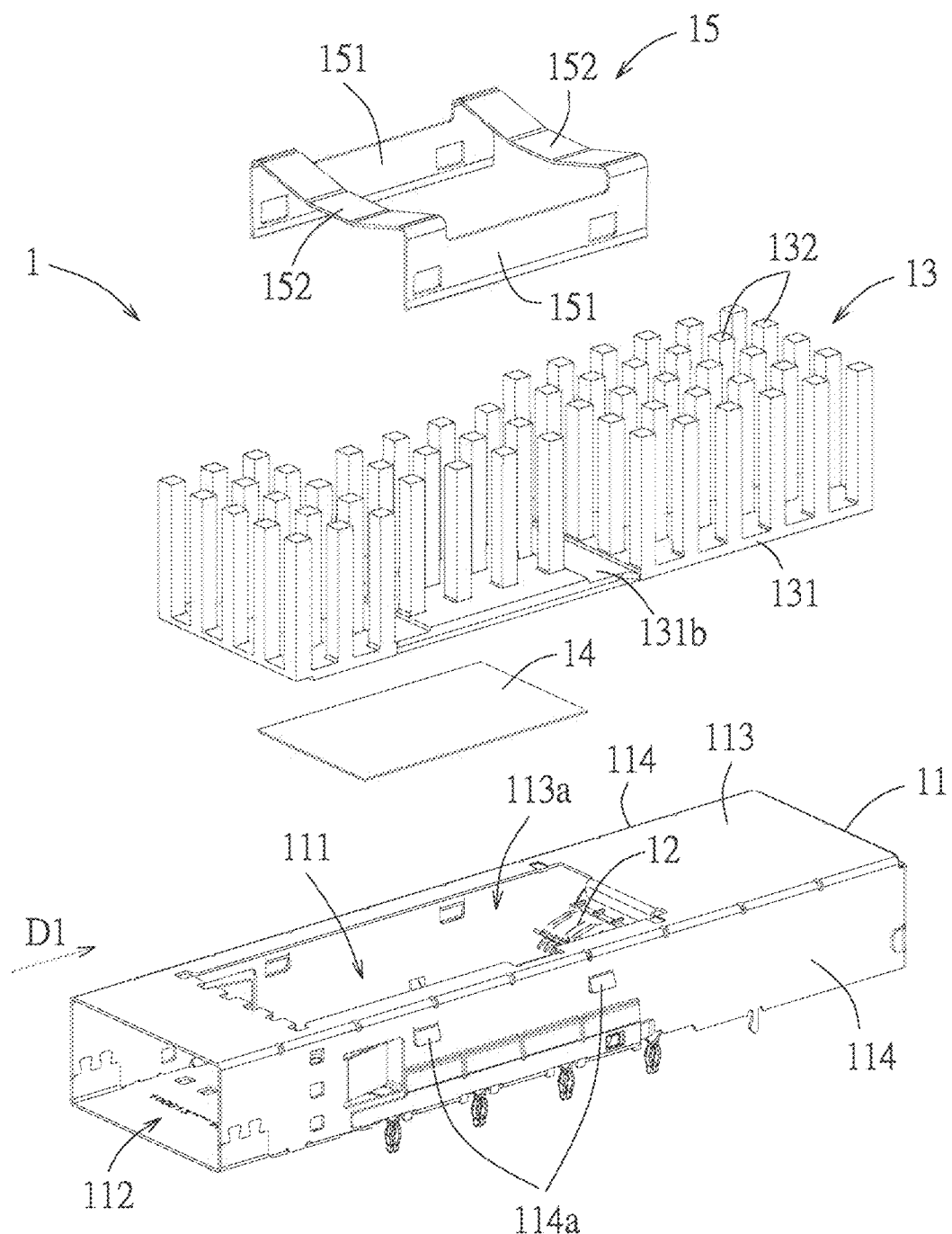
FIG. 3 is an exploded perspective view of the receptacle.
Figure 4:
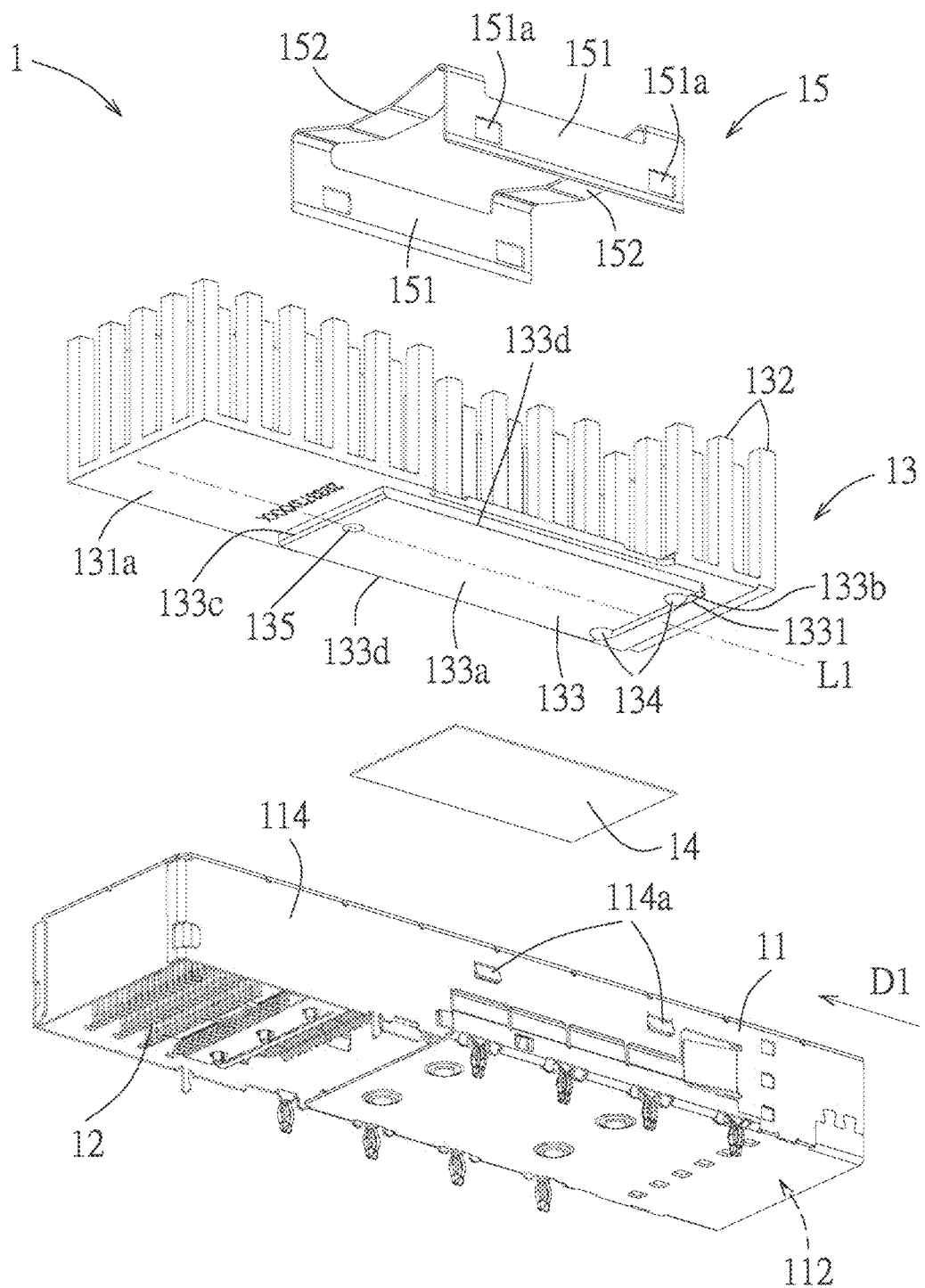
FIG. 4 is a view of FIG. 3 from another angle illustrating that a heat sink of the receptacle has two first convex portions and one first concave portion.

Referring to FIG. 3 and FIG. 4, the receptacle 1 includes a cage 11, an electrical connector 12, a heat sink 13, a thermal interface material layer 14 and an elastic sheathing member 15.

In the embodiment, the cage 11 defines an accommodation space 111 extending along a mating direction D1 and being elongated and a port 112 communicated with the accommodation space 111 in the mating direction D1. The port 112 allows the plug 2 (see FIG. 2) to correspondingly insert into and extend into the accommodation space 111. The cage 11 has an upper wall 113 positioned above the accommodation space 111 and two side walls 114 respectively extending downwardly from two opposite sides of the upper wall 113 parallel to the mating direction D1. The upper wall 113 has an opening 113a which is rectangular and communicated with the accommodation space 111. Each side wall 114 has two latching portions 114a adjacent to the opening 113a and turned outwardly. The electrical connector 12 is provided at an end of the accommodation space 111 away from the port 112 and is used to electrically connect the plug 2 extending into the receptacle 1.

The heat sink 13 is provided on the upper wall 113 of the cage 11 and is used to contact the plug 2 and assist the plug 2 to dissipate heat by means of heat conduction. In the embodiment, the heat sink 13 has a heat conduction plate portion 131, a plurality of heat dissipating fin portions 132, a base portion 133, two first convex portions 134 and a first concave portion 135. The heat conduction plate portion 131 is rectangular and has a bottom surface 131a covering the upper wall 113 and a top surface 131b opposite to the bottom surface 131a. The plurality of heat dissipating fin portions 132 are arranged as an array on the top surface 131b. The base portion 133 is provided on the bottom surface 131a and extends into the opening 113a of the cage 11. The base portion 133 is in a shape of a rectangular boss, and has a lower surface 133a facing the accommodation space 111, a first side edge 133b close to the port 112, a second side edge 133c spaced apart from the first side edge 133b in the mating direction D1, and two third side edges 133d positioned at opposite positions and connecting the first side edge 133b and the second side edge 133c. The first side edge 133b forms a first inclined surface 1331. The two first convex portions 134 are provided on the lower surface 133a of the base portion 133 and respectively adjacent to two corners of the base portion 133 close to the first side edge 133b, and are arranged as a straight line in a direction parallel to the first side edge 133b. An appearance of each first convex portion 134 is hemispherical in the embodiment, but in varied embodiments, can also be half wheel or other shapes, as long as a surface of each first convex portion 134 is arc-shaped in the mating direction D1. The first concave portion 135 is provided on the lower surface 133a and adjacent to the second side edge 133c, and the first concave portion 135 is positioned on a line L1 which is parallel to the mating direction D1 and passes through between the two first convex portions 134. In an embodiment, the line L1 is a center line of the lower surface 133a.

Figure 17:
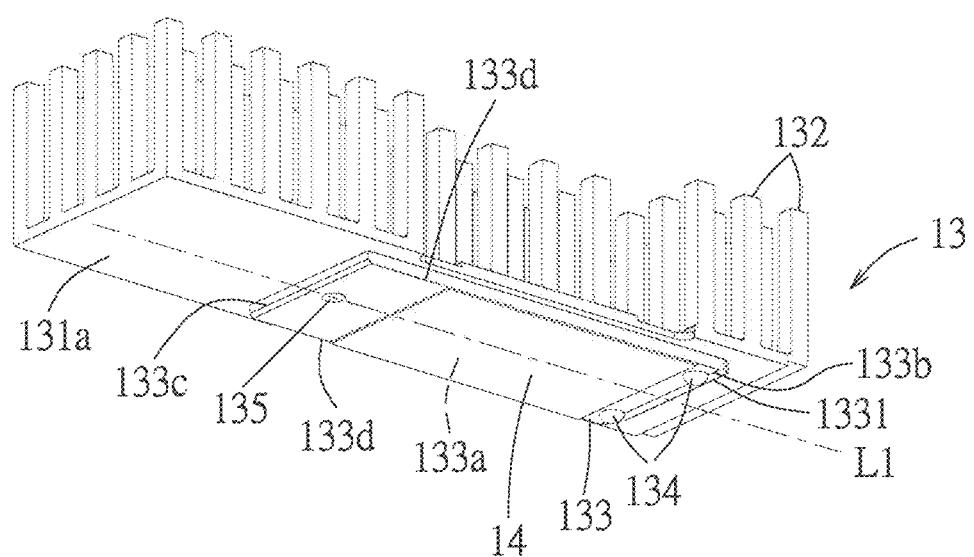
FIG. 17 is a schematic view illustrating that the thermal interface material layer of the first embodiment or the second embodiment can be formed on a lower surface of a base portion by adhering, coating, electroplating or anodizing.

The thermal interface material layer 14 is a thermal interface material (TIM) used for IC packaging and electronic heat dissipation. As shown in FIG. 17, the thermal interface material layer 14 can be formed on the lower surface 133a of the base portion 133 by adhering, coating, plating or anodizing. In the embodiment, as shown in FIG. 4, the thermal interface material layer 14 is mainly composed of graphene, and is provided on the lower surface 133a in form of thermal conductive sheet to contact the plug 2 extending into the cage 11, so as to fill a gap which may be formed between the plug 2 and the heat sink 13 and assist to transfer the thermal energy generated by the plug 2 to the heat sink 13. The thermal interface material layer 14 is flush with two third side edges 133d respectively on the left and right sides, and as close as possible to the two first convex portions 134 and the first concave portion 135 respectively on a front side and a rear side to maximize the effective heat conduction area of the thermal interface material layer 14. In a varied embodiment, the thermal interface material layer 14 is designed to fully cover the lower surface 133a of the base portion 133.

The elastic sheathing member 15 sheathes the heat sink 13 and the cage 11, so as to make the heat sink 13 and the cage 11 relatively fixed and elastically press against the heat sink 13 so that the base portion 133 of the heat sink 13 is elastically pressed downwardly into the opening 113a of the cage 11 and partially enters into the accommodation space 111. The elastic sheathing member 15 has two side engaging plate portions 151 extending in the mating direction D1, spaced apart from each other and facing each other, and two elastic downward pressing portions 152 connecting upper edges of the two side engaging plate portions 151 and spaced apart from each other. Each side engaging plate portion 151 has two latching holes 151a. The latching holes 151a of the two side engaging plate portions 151 are respectively detachably latched to the latching portions 114a of the two side walls 114 of the cage 11. The two elastic downward pressing portions 152 respectively pass through two gaps between the heat dissipating fin portions 132 and abut against the top surface 131b of the heat conduction plate portion 131.

Figure 5:
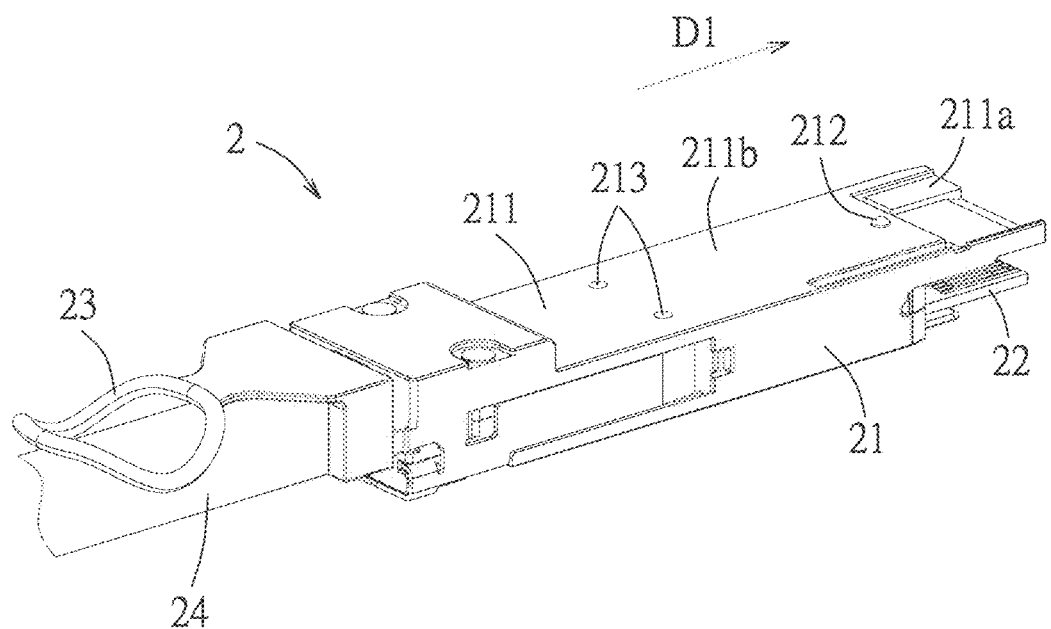
FIG. 5 is a perspective view of the plug illustrating that a housing of the plug has a second convex portion for cooperating with the first concave portion and two second concave portions for cooperating with two first convex portions.
Figure 6:
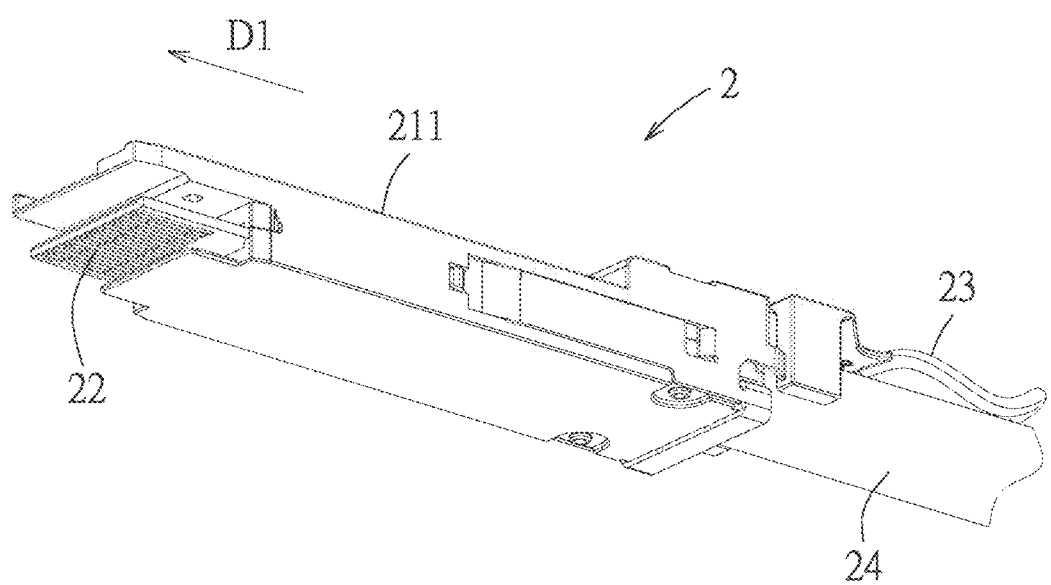
FIG. 6 is a view of FIG. 5 from another angle.

In combination with referring to FIG. 5 and FIG. 6, the plug 2 includes a housing 21, a mating paddle card 22, a releasable locking element 23, and a cable 24. The housing 21 has an insertion portion 211, a second convex portion 212 and two second concave portions 213. The insertion portion 211 is used to enter into the accommodation space 111 of the cage 11 along the mating direction D1 and has a front end 211a and an upper surface 211b. The second convex portion 212 is provided on the upper surface 211b and close to the front end 211a, and the second convex portion 212 is used to be cooperatively engaged with the first concave portion 135 of the heat sink 13. The two second concave portions 213 are provided on the upper surface 211b and away from the front end 211a, and the two second concave portions 213 are used to be cooperatively engaged with the two first convex portions 134 of the heat sink 13. An appearance of the second convex portion 212 is hemispherical in the embodiment, but in varied embodiments, it can also be half wheel or other shapes, as long as a surface of the second convex portion 212 is arc-shaped in the mating direction D1. The mating paddle card 22 is provided at the front end 211a of the housing 21 and is used to electrically connect the electrical connector 12 of the receptacle 1. The releasable locking element 23 is connected to a rear end of the housing 21 and can be pulled to pull out the insertion portion 211 from the receptacle 1. The cable 24 is connected to the rear end of the housing 21 and is electrically connected with the mating paddle card 22.

Figure 7:
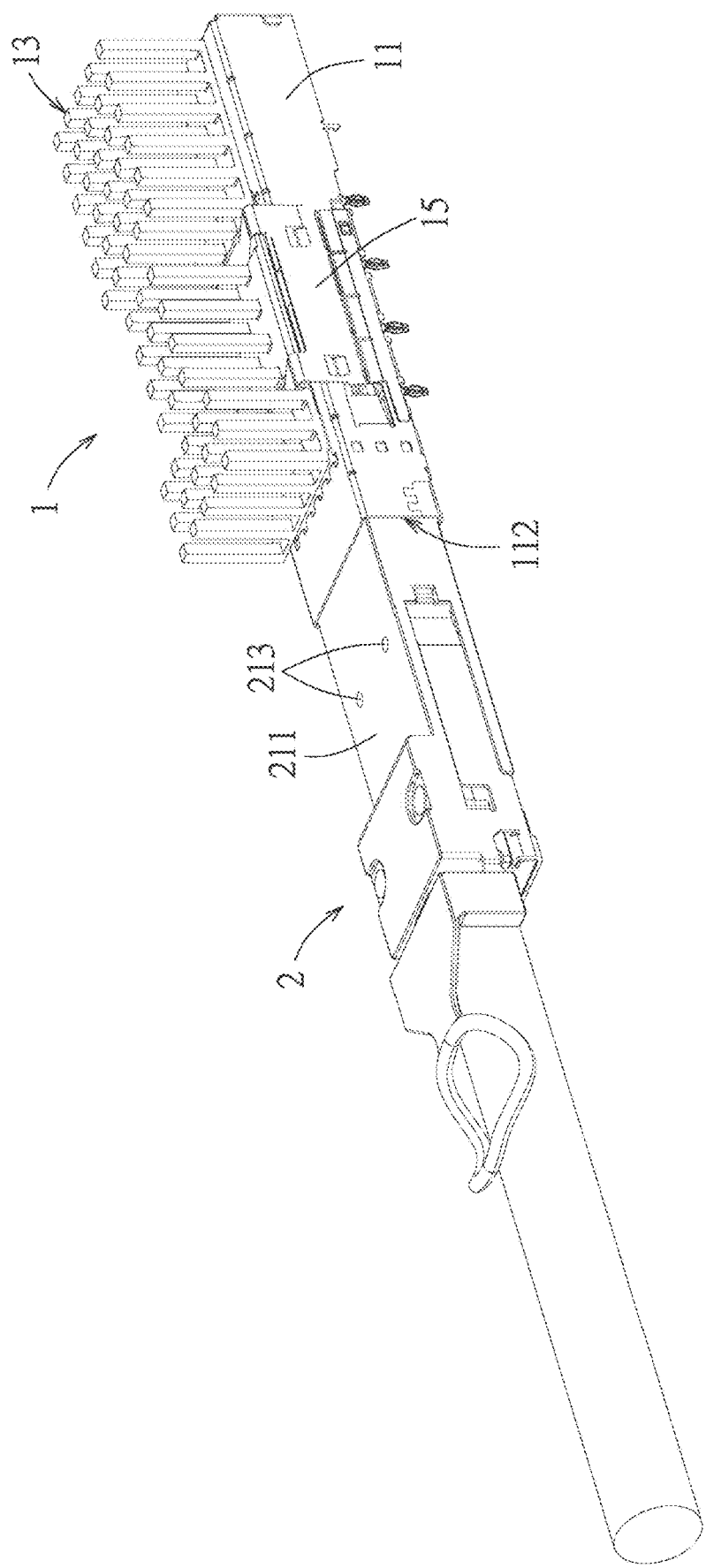
FIG. 7 is a perspective view illustrating an initial stage of mating of the plug and the receptacle.
Figure 8:
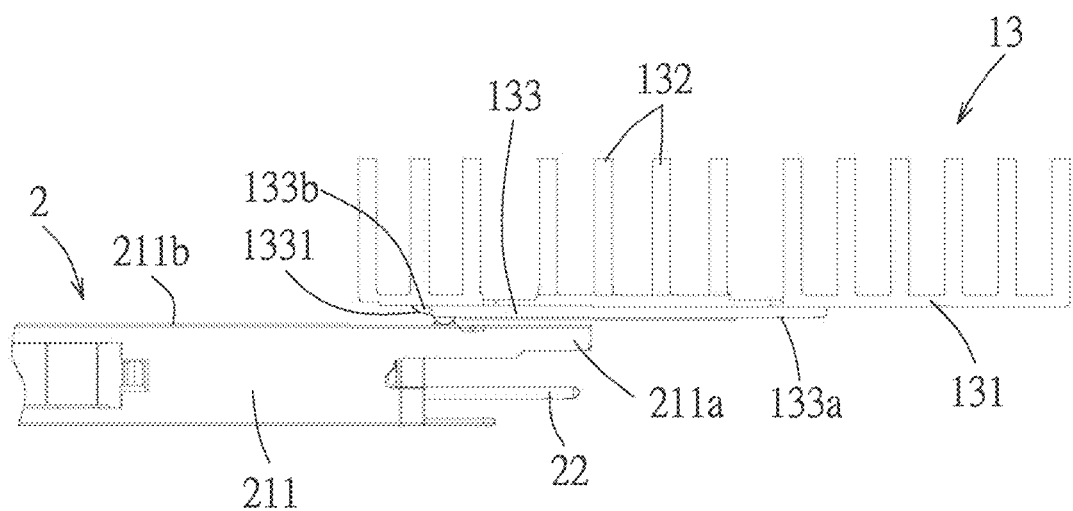
FIG. 8 is an incomplete partial side view illustrating that the second convex portion of the plug slides over a first side edge of the heat sink and abuts against a lower surface of the heat sink.
Figure 9:
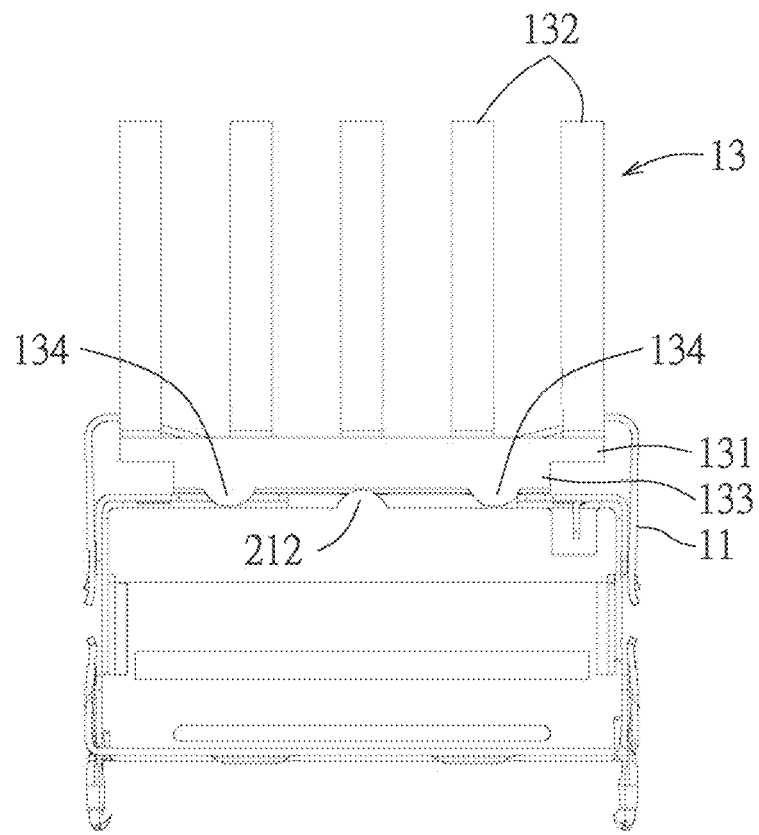
FIG. 9 is a schematic view illustrating that the second convex portion of the plug and the two first convex portions of the receptacle are arranged as a line.

Referring to FIG. 7 to FIG. 9, in an initial stage of mating of the plug 2 and the receptacle 1, the second convex portion 212 on the insertion portion 211 passes through the port 112 and contacts the first side edge 133b of the base portion 133 along the line L1 (see FIG. 4). Because the heat sink 13 is fixed to the cage 11 by the elasticity of the elastic sheathing member 15, when the second convex portion 212 slides downwardly along the first inclined surface 1331 of the first side edge 133b onto the lower surface 133a of the base portion 133, the heat sink 13 will be pushed by the second convex portion 212 at the same time and slightly lifted upwardly. The purpose of the arc-shaped surface of the second convex portion 212 is to reduce the resistance generated when the second convex portion 212 passes through the first inclined surface 1331 of the first side edge 133b. At this time, the second convex portion 212 is arranged with the two first convex portions 134 as a line (see FIG. 9).

Figure 10:
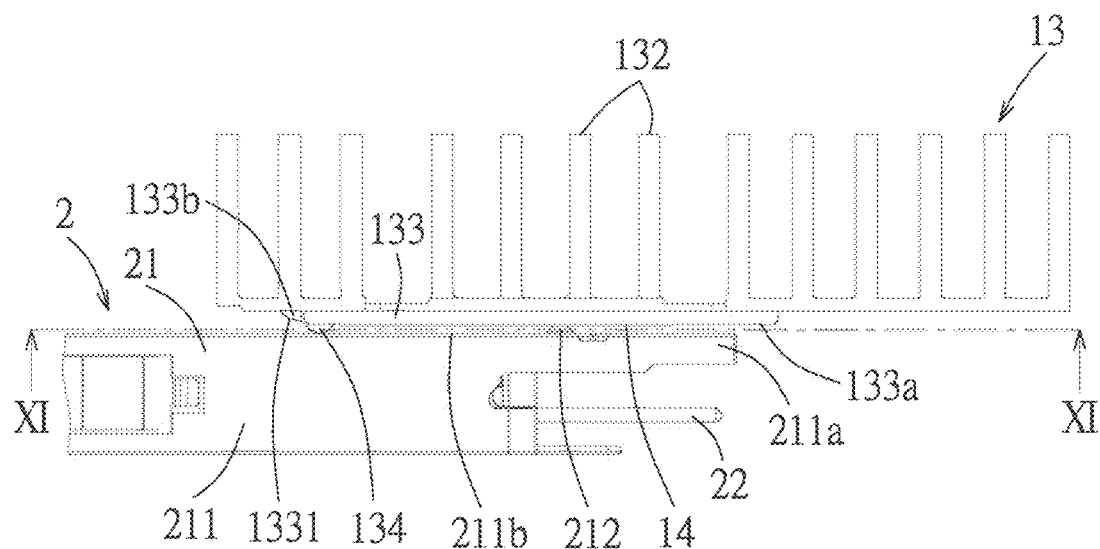
FIG. 10 is an incomplete partial side view illustrating that in the process of mating of the plug and the receptacle, the second convex portion abuts against a thermal interface material layer of the receptacle upwardly and two first convex portions abut against the housing downwardly.
Figure 11:
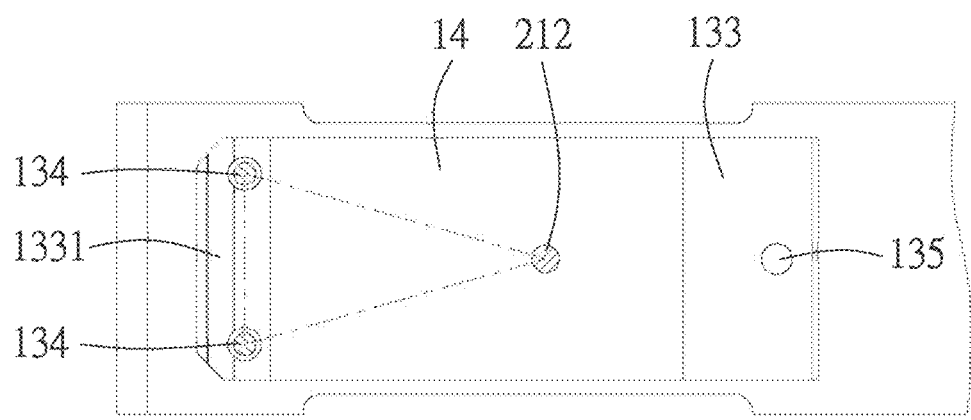
FIG. 11 is a cross sectional view taken along a line XI-XI of FIG. 10, illustrating that the second convex portion and the two first convex portions are correspondingly positioned at three vertices of a triangle.

Referring to FIG. 10 and FIG. 11, as the insertion portion 211 extends into the accommodation space 111 (see FIG. 3), the second convex portion 212 continues to move on the lower surface 133a of the base portion 133 along the line L1 (see FIG. 4) and presses against the thermal interface material layer 14, and that the surface of the second convex portion 212 is arc-shaped can reduce the resistance while moving. It should be particularly noted that the second convex portion 212 is separated from the line connecting the two first convex portions 134 and forms a continuously expanding triangle together with the two first convex portions 134. The second convex portion 212 and the two first convex portions 134 are positioned at the three vertices of the triangle, and the second convex portion 212 abuts against the thermal interface material layer 14 upwardly and the two first convex portions 134 abut against the upper surface 211b of the housing 21 downwardly, so that a gap is formed between the upper surface 211b of the housing 21 and the thermal interface material layer 14 to maintain the heat sink 13 in balance in the process of mating of the plug 2 and the receptacle 1 (see FIG. 7), and avoid the front end 211a of the plug 2 scraping the thermal interface material layer 14 due to the inclination of the heat sink 13. The arc shaped surface of each second convex portion 134 can also reduce the resistance to the plug 2.

Figure 12:
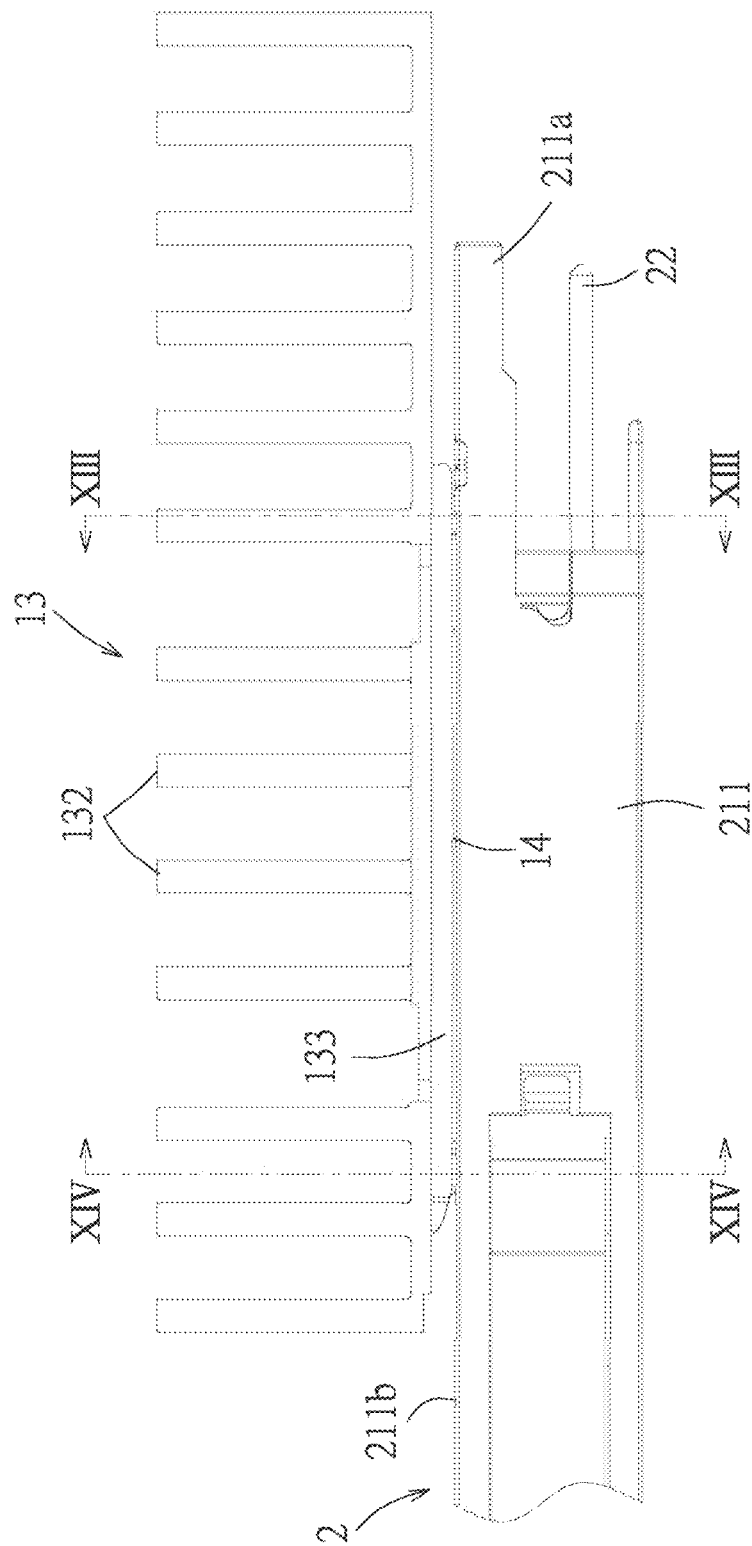
FIG. 12 is an incomplete partial side view illustrating that when mating of the plug and the receptacle is completed, the thermal interface material layer is attached to an upper surface of the housing.
Figure 13:
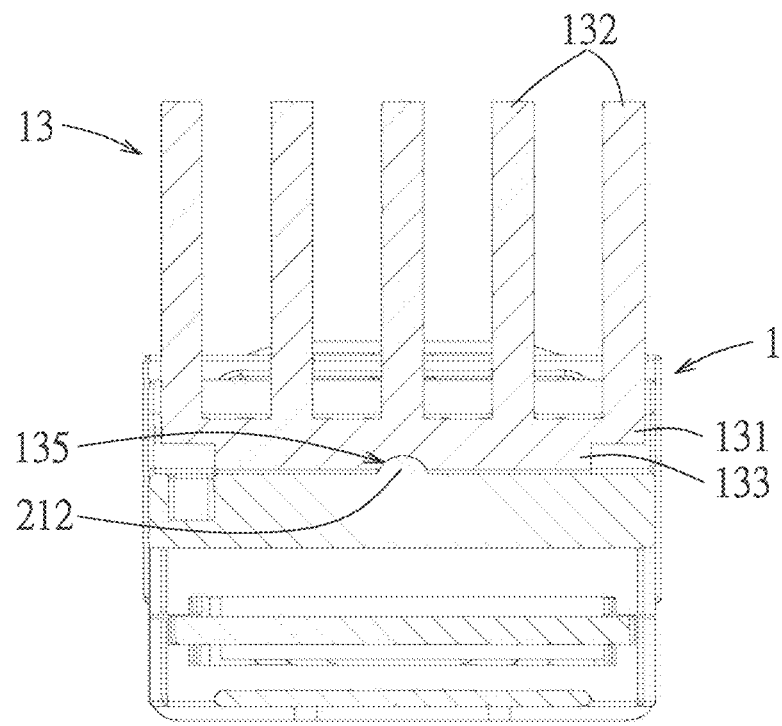
FIG. 13 is a cross sectional view taken along a line XIII-XIII of FIG. 12, illustrating that the second convex portion and the first concave portion are cooperatively engaged with each other.
Figure 14:
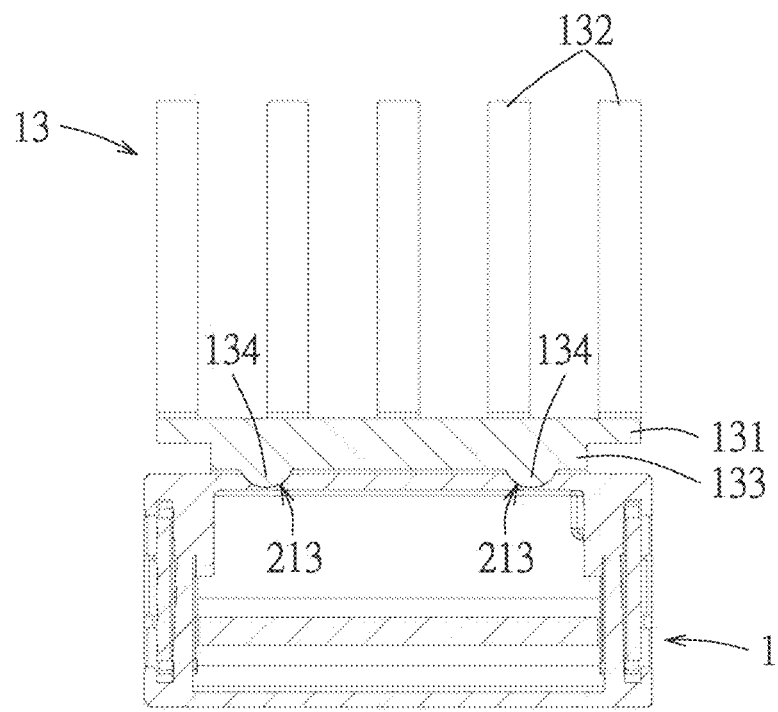
FIG. 14 is a cross sectional view taken along a line XIV-XIV of FIG. 12, illustrating that the two second concave portions and the two first convex portions are cooperatively engaged with each other.

Referring to FIG. 12 to FIG. 14, when the second convex portion 212 moves to a position corresponding to the first concave portion 135, the second convex portion 212 is engaged with the first concave portion 135 in concave-convex cooperation, meanwhile, the two first convex portions 134 are also engaged with the two second concave portions 213 respectively in concave-convex cooperation. The gap between the upper surface 211b of the housing 21 and the thermal interface material layer 14 disappears and the thermal interface material layer 14 is flatly attached to the upper surface 211b, therefore the mating of the plug 2 and the receptacle 1 is completed. It is worth mentioning that the second convex portion 212 will only form one indentation (equivalent to one track) on the thermal interface material layer 14, so that most of an area of the thermal interface material layer 14 can still be completely attached to the housing 21, the electrical connection apparatus 100 has better heat conduction effect in comparison with the existing heat sink.

Figure 15:
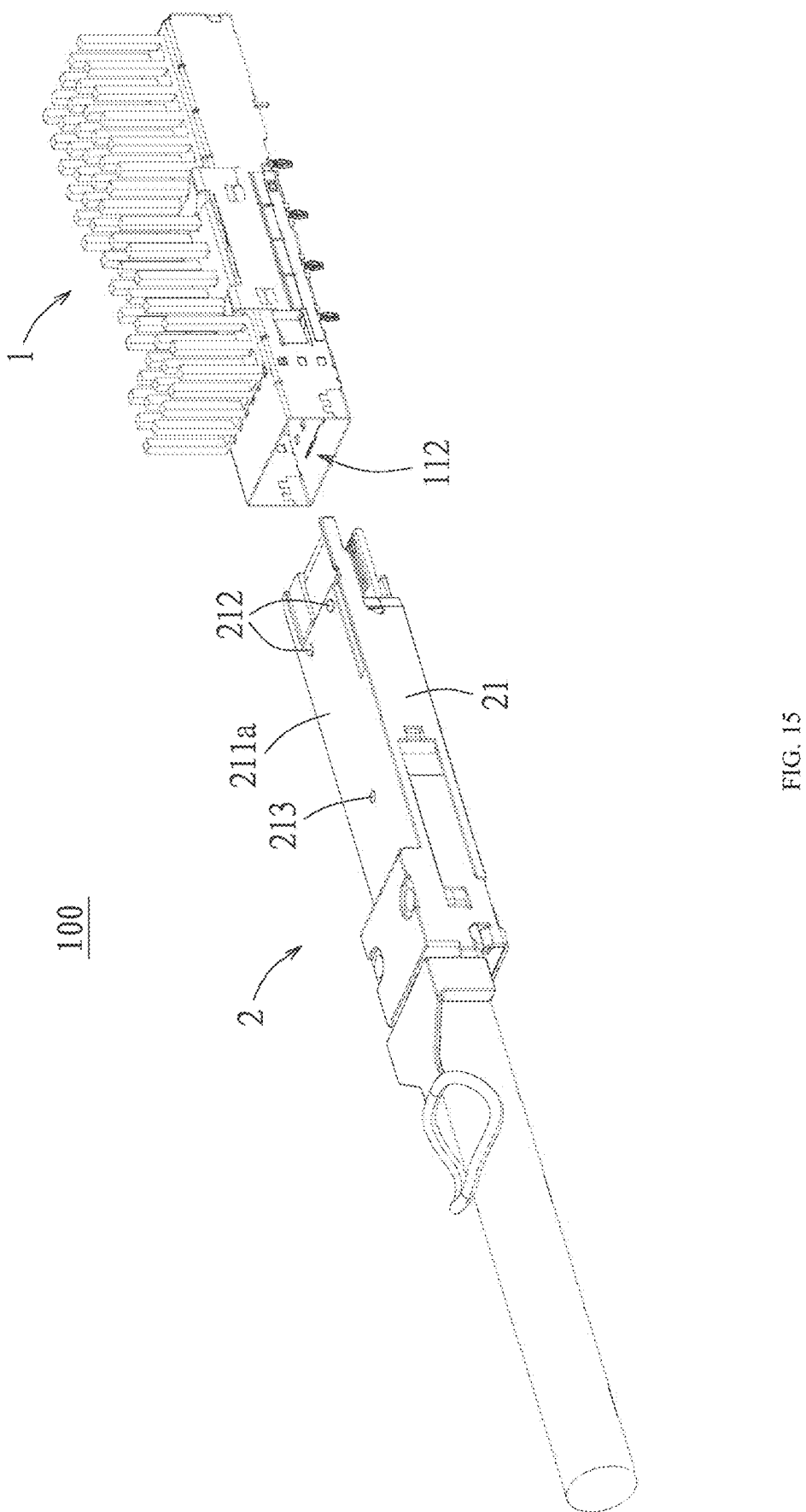
FIG. 15 is a perspective view of a second embodiment of the electrical connection apparatus of the present disclosure.
Figure 16:
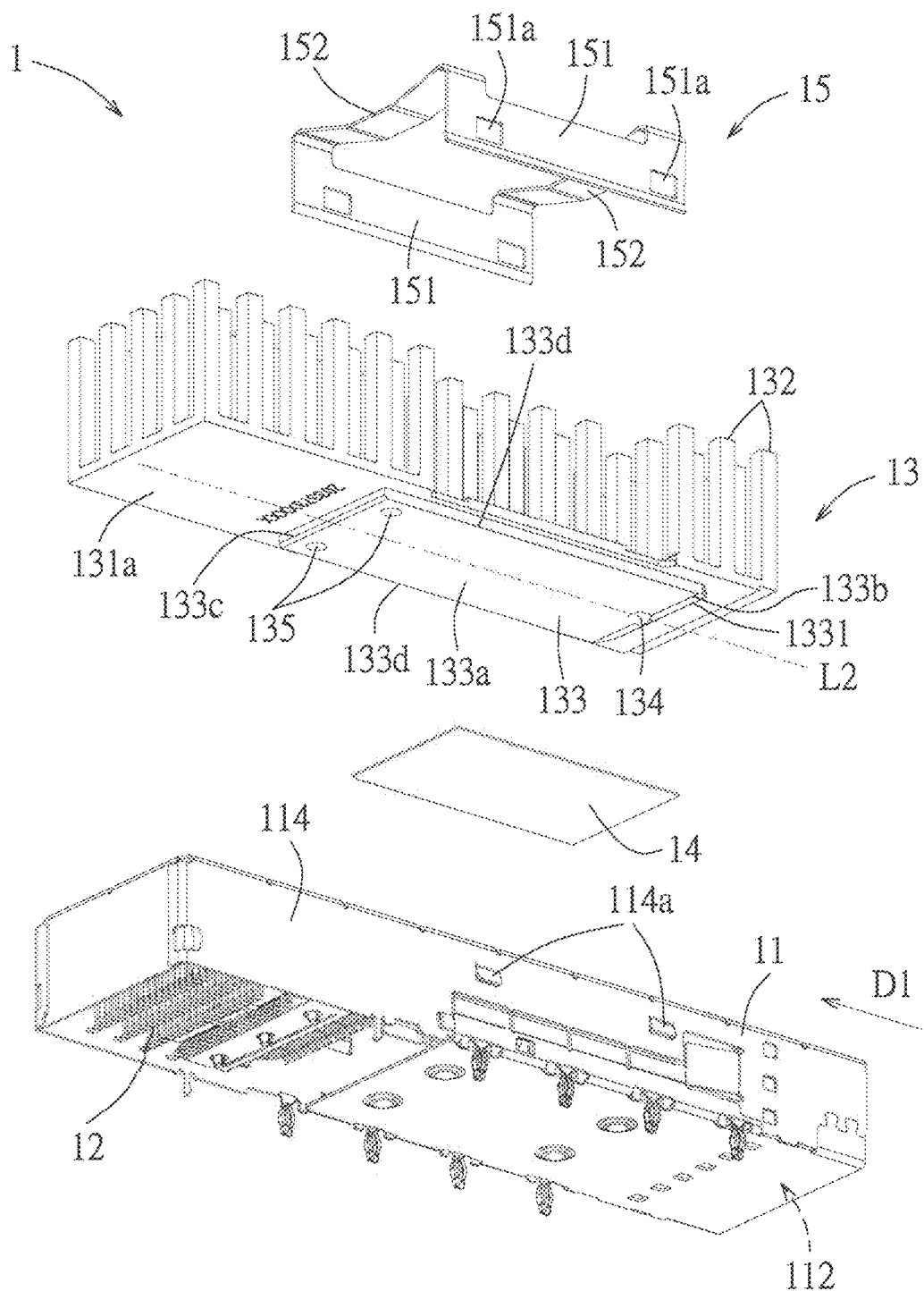
FIG. 16 is an exploded perspective view of the second embodiment.

Referring to FIG. 15 and FIG. 16, a second embodiment of an electrical connection apparatus 100 of the present disclosure is substantially the same as the first embodiment, a difference lies in that the number of the first convex portion 134 of the receptacle 1 of the second embodiment is one, the number of the first concave portion 135 is two, and the first concave portion 135 is positioned on a line L2 which is parallel to the mating direction D1 and passes through between the two first concave portions 135. In addition, the number of the second convex portion 212 of the plug 2 in the second embodiment is two and the number of the second concave portion 213 is one, so that when mating of the plug 2 and the receptacle 1 are completed, the two second convex portions 212 and the second concave portion 213 can also be engaged with the two first concave portions 135 and the first convex portion 134 respectively in concave-convex cooperation, and the thermal interface material layer 14 is attached to the upper surface 211b. In the process of mating of the plug 2 and the receptacle 1, the two second convex portions 212 and the first convex portion 134 can also form a continuously expanding triangle, and the two second convex portions 212 and the first convex portion 134 are correspondingly distributed on the three vertices of the triangle, the two second convex portions 212 abut against the thermal interface material layer 14, and the first convex portion 134 abuts against the upper surface 211b of the housing 21, so that a gap is formed between the upper surface 211b of the housing 21 and the thermal interface material layer 14 to similarly maintain the heat sink 13 in balance in the mating process of the plug 2 and the receptacle 1, avoid the front end 211a of the plug 2 scraping the thermal interface material layer 14 due to the inclination of the heat sink 13. In addition, the two second convex portions 212 will only form two indentations (equivalent to two tracks) on the thermal interface material layer 14, which still has better heat conduction effect in comparison with the existing heat sink.

In conclusion, in the process of inserting of the plug 2 into the cage 11 in the electrical connection apparatus 100 of the present disclosure, the first convex portion 134 at a bottom of the heat sink 13 and the second convex portion 212 of the plug 2 are connected to form a triangle, so that a gap is formed between the upper surface 211b of the housing 21 and the thermal interface material layer 14 to maintain the heat sink 13 horizontal even if the plug 2 can is not fully inserted into the cage 11; in addition, the electrical connection apparatus 100 forms an indentation only on a position of the surface of the thermal interface material layer 14 where the second convex portion 212 passes through the thermal interface material layer 14, and has a higher heat dissipation effect in comparison with the existing heat sink.

However, the above described contents are only the embodiments of the present disclosure, cannot limit the implementing scope of the present disclosure, all simple equivalent changes and modifications made according to the claims of the present disclosure and the contents of the specification are still within the scope of the present disclosure.

The invention claimed is:

1. An electrical connection apparatus comprising:
a receptacle comprising:
  a cage defining an accommodation space extending along a mating direction and being elongated and a port in communication with the accommodation space in the mating direction, the cage having an upper wall, the upper wall having an opening in communication with the accommodation space;
  a heat sink provided on the upper wall and having a base portion extending into the opening, the base portion having a lower surface facing the accommodation space, a first side edge and a second side edge spaced apart from the first side edge in the mating direction, the first side edge being closer to the port than the second side edge, the heat sink further having two first convex portions positioned on the lower surface of the base portion and adjacent to the first side edge and a first concave portion positioned on the lower surface and adjacent to the second side edge, the first concave portion being positioned on a line which is parallel to the mating direction and passes through between the two first convex portions;
  a thermal interface material layer provided on the lower surface of the base portion; and
  an elastic sheathing member sheathing the heat sink and the cage, so that the base portion of the heat sink being elastically pressed downwardly into the opening of the cage; and
a plug comprising a housing, the housing having an upper surface, a second convex portion positioned on the upper surface and used to cooperate with the first concave portion, and two second concave portions positioned on the upper surface and used to cooperate with the two first convex portions respectively, when mating of the plug and the receptacle is completed, the second convex portion and the two second concave portions being respectively engaged with the first concave portion and the two first convex portions in concave-convex cooperation, the thermal interface material layer being attached to the upper surface.

2. The electrical connection apparatus of claim 1, wherein the thermal interface material layer is mainly composed of graphene.

3. The electrical connection apparatus of claim 1, wherein in the mating of the plug and the receptacle, the second convex portion and the two first convex portions are correspondingly distributed at three vertices of a triangle, and the second convex portion abuts against the thermal interface material layer, the two first convex portions abut against the upper surface of the housing, so that a gap is formed between the upper surface of the housing and the thermal interface material layer.

4. The electrical connection apparatus of claim 1, wherein the base portion is a boss, and the first side edge forms a first inclined surface for the second convex portion to slide over to abut against the lower surface of the base portion.

5. The electrical connection apparatus of claim 1, wherein the two first convex portions are arranged in a direction parallel to the first side edge.

6. The electrical connection apparatus of claim 1, wherein the two first convex portions and the second convex portion are arc-shaped in the mating direction.

7. The electrical connection apparatus of claim 1, wherein the cage further has two side walls respectively extending downwardly from two opposite sides of the upper wall, each side wall has a plurality of latching portions, the heat sink further has a heat conduction plate portion and a plurality of heat dissipating fin portions, and the heat conduction plate portion has a bottom surface connected to the base portion and a top surface opposite to the bottom surface, the plurality of the heat dissipating fin portions are provided on the top surface, and the elastic sheathing member has two elastic downward pressing portions for passing through between the plurality of the heat dissipating fin portions and abutting against the top surface of the heat conduction plate portion and two side engaging plate portions connected to two ends of the two elastic downward pressing portions and detachably latched to the latching portions of the two side walls.

8. The electrical connection apparatus of claim 1, wherein the base portion further has two third side edges positioned at opposite positions and connecting the first side edge and the second side edge, and the thermal interface material layer is positioned between the two first convex portions and the first concave portion and flush with the third side edges at two sides thereof.

9. An electrical connection apparatus comprising:
a receptacle comprising:
  a cage defining an accommodation space extending along a mating direction and being elongated and a port communicated with the accommodation space in the mating direction, the cage having an upper wall, the upper wall having an opening communicated with the accommodation space;

a heat sink provided to the upper wall and having a base portion extending into the opening, the base portion having a lower surface facing the accommodation space, a first side edge and a second side edge spaced apart from the first side edge in the mating direction, the first side edge being closer to the port than the second side edge, the heat sink further having a first convex portion provided on the lower surface of the base portion and adjacent to the first side edge and two first concave portions provided on the lower surface and adjacent to the second side edge, the first convex portion being positioned on a line which is parallel to the mating direction and passes through between the two first concave portions;

a thermal interface material layer provided to the lower surface of the base portion; and an elastic sheathing member sheathing the heat sink and the cage, so that the base portion of the heat sink being elastically pressed downwardly into the opening of the cage; and a plug comprising a housing, the housing having an upper surface, two second convex portions positioned on the upper surface and used to cooperate with the two first concave portions and a second concave portion positioned on the upper surface and used to cooperate with the first convex portion, when mating of the plug and the receptacle is completed, the two second convex portions and the second concave portion being respectively engaged with the two first concave portions and the first convex portion in concave-convex cooperation, the thermal interface material layer being attached to the upper surface.

10. The electrical connection apparatus of claim 9, wherein the thermal interface material layer is mainly composed of graphene.

11. The electrical connection apparatus of claim 9, wherein in the mating of the plug and the receptacle, the two second convex portions and the first convex portion are correspondingly distributed at three vertices of a triangle, and the two second convex portions abut against the thermal interface material layer, the first convex portion abuts against the upper surface of the housing, so that a gap is formed between the upper surface of the housing and the thermal interface material layer.

12. The electrical connection apparatus of claim 9, wherein the base portion is a boss, the first side edge forms a first inclined surface for the two second convex portions to slide over to abut against the lower surface of the base portion.

13. The electrical connection apparatus of claim 9, wherein the first convex portion and the two second convex portions are arc-shaped in the mating direction.

14. The electrical connection apparatus of claim 9, wherein
the cage further has two side walls respectively extending downwardly from two opposite sides of the upper wall, each side wall has a plurality of latching portions,
the heat sink further has a heat conduction plate portion and a plurality of heat dissipating fin portions, the heat conduction plate portion has a bottom surface connected to the base portion and a top surface opposite to the bottom surface, the plurality of the heat dissipating fin portions are provided to the top surface, and the elastic sheathing member has two elastic downward pressing portions for passing through between the plurality of the heat dissipating fin portions and abutting against the top surface of the heat conduction plate portion and two side engaging plate portions connected to two ends of the two elastic downward pressing portions and detachably latched to the latching portions of the two side walls.

15. The electrical connection apparatus of claim 9, wherein the base portion further has two third side edges positioned at opposite positions and connecting the first side edge and the second side edge, and the thermal interface material layer is positioned between the two first concave portions and the first convex portion and flush with the third side edges at two sides thereof.

16. An electrical connection apparatus comprising:
a receptacle comprising:
a cage defining an accommodation space extending along a mating direction and being elongated and a port in communication with the accommodation space in the mating direction, the cage having an upper wall, the upper wall having an opening in communication with the accommodation space;

a heat sink provided on the upper wall and having a base portion extending into the opening, the base portion having a lower surface facing the accommodation space, a first side edge and a second side edge spaced apart from the first side edge in the mating direction, the first side edge being closer to the port than the second side edge, the heat sink further having two first convex portions positioned on the lower surface of the base portion and adjacent to the first side edge and a first concave portion positioned on the lower surface and adjacent to the second side edge, the first concave portion being positioned on a line which is parallel to the mating direction and passes through between the two first convex portions;

a thermal interface material layer provided on the lower surface of the base portion; and an elastic sheathing member sheathing the heat sink and the cage, so that the base portion of the heat sink being elastically pressed downwardly into the opening of the cage.

17. The electrical connection apparatus of claim 16, wherein the thermal interface material layer is mainly composed of graphene.

18. The electrical connection apparatus of claim 16, wherein the two first convex portions are arranged in a direction parallel to the first side edge.

19. The electrical connection apparatus of claim 16, wherein
the cage further has two side walls respectively extending downwardly from two opposite sides of the upper wall, each side wall has a plurality of latching portions,
the heat sink further has a heat conduction plate portion and a plurality of heat dissipating fin portions, and the heat conduction plate portion has a bottom surface connected to the base portion and a top surface opposite to the bottom surface, the plurality of the heat dissipating fin portions are provided on the top surface, and
the elastic sheathing member has two elastic downward pressing portions for passing through between the plurality of the heat dissipating fin portions and abutting against the top surface of the heat conduction plate portion and two side engaging plate portions connected to two ends of the two elastic downward pressing portions and detachably latched to the latching portions of the two side walls.

20. The electrical connection apparatus of claim 16, wherein the base portion further has two third side edges positioned at opposite positions and connecting the first side edge and the second side edge, and the thermal interface material layer is positioned between the two first convex portions and the first concave portion and flush with the third side edges at two sides thereof.

* * * * *